US012756383B2

(12) United States Patent
Wu

(10) Patent No.: US 12,756,383 B2
(45) Date of Patent: Oct. 6, 2026

(54) SWITCHING OF POWER SEMICONDUCTOR DEVICES BY PROGRAMMABLE CURRENT PULSES

(71) Applicant: OPTUNITY, Inc., Hayward, CA (US)

(72) Inventor: Ta-Chung Wu, Hayward, CA (US)

(73) Assignee: OPTUNITY, Inc, Hayward, CA (US)

( * ) Notice: Subject to any disclaimer, the term of this patent is extended or adjusted under 35 U.S.C. 154(b) by 226 days.

(21) Appl. No.: 18/755,581

(22) Filed: Jun. 26, 2024

(65) Prior Publication Data

US 2026/0005685 A1 Jan. 1, 2026

(51) Int. Cl.

| | |
|---|---|
| ***H02M 1/08*** | (2006.01) |
| ***H03K 17/06*** | (2006.01) |
| ***H03K 17/687*** | (2006.01) |
| ***H03K 17/74*** | (2006.01) |
| ***H03K 17/78*** | (2006.01) |

(52) U.S. Cl.

CPC ............ *H03K 17/063* (2013.01); *H02M 1/08* (2013.01); *H03K 17/687* (2013.01); *H03K 17/74* (2013.01); *H03K 17/78* (2013.01)

(58) Field of Classification Search

CPC .... H03K 17/063; H03K 17/687; H03K 17/74; H03K 17/78; H03K 17/785; H03K 17/08122; H03K 17/689; H03K 17/04123; H03K 2217/0036; H02M 1/08

See application file for complete search history.

(56) References Cited

U.S. PATENT DOCUMENTS 4,777,387 A * 10/1988 Collins ................ H03K 17/785 257/E29.256
5,391,997 A * 2/1995 Meyer .................. H03K 17/785 327/515
2010/0019807 A1* 1/2010 Zhang .................. H03K 17/145 327/109
2012/0068683 A1* 3/2012 Liu ......................... H02M 1/08 323/311

OTHER PUBLICATIONS

Mazumder and Sarkar, "Optically Activated Gate Control for Power Electronics," IEEE Trans. Power Electronics, vol. 26, No. 10, pp. 2863-2886, Oct. 2011 (Year: 2011).*

* cited by examiner

*Primary Examiner* — Monica Lewis
*Assistant Examiner* — Jye-June Lee
(74) *Attorney, Agent, or Firm* — Weiss and Moy, P.C.; Jeffrey D. Moy

(57) ABSTRACT

A circuit for switching a power semiconductor device has a power semiconductor device. A controlled current pulse source is coupled to the power semiconductor device generating a positive current pulse to switch ON the power semiconductor device and a negative current pulse to switch OFF the power semiconductor device.

11 Claims, 12 Drawing Sheets

PWL(0.0U -5 2.0U -5 2.001U 40 2.050U 40 2.051U 11 6.0U 11 6.001U -20 6.050U -20 6.051U -5 8.0U -5 8.001U 40 8.050U 40 8.051U 11 10.0U 11 10.001U -20 10.050U -20 10.051U -5 15.0U-5)

SWITCHING OF POWER SEMICONDUCTOR DEVICES BY PROGRAMMABLE CURRENT PULSES

TECHNICAL FIELD

The present application, in general, relates to semiconductor devices, and more specifically, to a metal oxide semiconductor field effect transistor (MOSFET), and similar types of power semiconductors wherein on/off switching is controlled by using short current pulses.

BACKGROUND

Power semiconductor devices may be semiconductor devices that perform the modified electronic functions of regular semiconductor devices with a high-power rating. However, unlike other semiconductor devices, power semiconductor devices may be capable of withstanding high voltage and current with lesser leakage, voltage drop, and other power losses. Power semiconductor devices may be used for switching ON/OFF of electricity, as a component in converters and inverters, and may be used in power amplifiers to amplify a signal.

As stated above, power semiconductor devices may be used as voltage-controlled power switching devices, through which, a large amount of power on the load can be quickly switched on and off, when a voltage control signal may be applied. Referring to FIG. 1A, a MOSFET device 10 may be seen. The MOSFET device 10 may act as a switch, controlled by an on/off control voltage source 12, switching on and off the power flowing through a load 14.

Referring to FIG. 1A-1B, operation of the MOSFET 10 may be disclosed with FIG. 1B showing the whole switching process on a time scale, where the MOSFET 10 may consume certain power during the switching period. During the switching process, an on/off operational control voltage from the on/off control voltage source 12, usually triggered by a control signal, which may be a low power/low voltage signal or even a weak light signal converted into a useful operational voltage through a gate driver circuitry may be applied between the gate G and source S terminals of the MOSFET 10. When the MOSFET 10 is in an OFF state, the voltage between the drain D and the source S terminals $V_{ds}$ of the MOSFET 10 may be equal to line source voltage $V_{DD}$, no current flows through the MOSFET 10, hence, no power flows through the load 14. When the control signal switches from an off to an on state, $V_{ds}$ quickly drop to zero, and the current las, which is equal to the current flows through the load 14, starts to flow, to a level mostly determined by the load 14. At steady state, the load 14 may see a power consumption of approximately $V_{DD}*I_D$, which could be a very large amount of power if $V_{DD}$ is in the hundreds to thousands of volts and the load current $I_D$ is in tens or even hundreds of amperes. During the transition, whenever $V_{ds}(t)*I_{ds}(t)>0$, a switching power loss may be consumed by the MOSFET 10, and the integration of $V_{ds}(t)*I_{ds}(t)$ over the transition period may be expressed in Joule as part of the switching loss, besides other power consumptions during the switching transition time. Similar things may happen in the turn-off transition period, only in a reverse sequence. The significance of switching loss $V_{ds}(t)*I_{ds}(t)$ is that it may determine how "ideal" the switching device can be. An ideal concept of a switch is that the switch device itself does not consume any power at all or a very minimum power as possible. Sometimes, it may not be necessarily just about how much percentage of the total power is consumed by the switching device, but also the consumed power would heat up the switching device and may very well hinder the operation of switching process.

Referring to FIG. 2A, a voltage or current versus time diagram of an ideal case of switching may be shown. In an ideal case, the voltage $V_{ds}$ switches to zero quickly during turn-on period before $I_{ds}$ starts to increase substantially, and vice versa for the turn-off period.

Referring to FIG. 2B, a voltage or current versus time diagram showing an intermediate case of switching may be shown. In the intermediate case of switching, the voltage $V_{ds}$ and $l_{ds}$ switch around the same time but not fast enough so the overlap of $V_{ds}$ and $I_{ds}$ may be larger than in the case of FIG. 2A but smaller than in FIG. 2C as may be discussed below.

Referring to FIG. 2C, a voltage or current versus time diagram showing a worst-case scenario may be shown. In the worst-case scenario, while keeping the same switching speed of $V_{ds}$ and $I_{ds}$, the voltage $V_{ds}$ does not start to switch before $I_{ds}$ reaches its maximum during the turn-on period, maximizing the overlap between $V_{ds}$ and $I_{ds}$. And vice versa for the turn-off period.

Hence, in the most ideal case of the switching process, $V_{ds}$ would switch from $V_{DD}$ to almost zero before $I_{ds}$ starts to increase substantially from zero during turn-on and vice versa during turn-off, as shown in FIG. 2A. Or an intermediate case as shown in FIG. 2B, where $V_{ds}$ and $I_{ds}$ are mildly overlapped because of the switching speed not being fast enough. However, in reality, switching is happening more like the worst-case scenario as shown in FIG. 2C. As illustrated in FIG. 2C, during turn-on, the Vas may remain high at $V_{DD}$ while $I_{ds}$ may increase from zero to $I_D$, and then drop to zero from $V_{DD}$ while $I_{ds}$ remain at a high level of $I_D$, maximizing the overlap between $V_{ds}$ and $I_{ds}$. To reduce the switching loss, one may realize that there are two elements to consider: one, to increase the switching speed of $V_{ds}$ and $I_{ds}$; and two, to reduce the overlap between $V_{ds}$ and $I_{ds}$, i.e. shifting the starting points of $V_{ds}$ and $I_{ds}$.

What happens in FIG. 2C may be due to the so-called Miller effect during switching. Referring now to FIGS. 3A-3B, a discussion on the Miller effect may be disclosed. As may be seen In FIG. 3A, to turn on a MOSFET, the capacitance between the gate and source terminals, $C_{GS}$, may first be charged, and the voltage between the gate and source terminals, $V_{gs}(t)$, may be built up over time. Once $V_{gs}>V_{TH}$, where $V_{TH}$ may be defined as the threshold voltage, or the minimum voltage required to form a conductive path for a current to start to flow from the drain to source terminals, this current $I_{ds}(t)$ may increase from zero all the way to $I_D$, while $V_{ds}(t)$ remains at high level of $V_{DD}$, simply because the capacitance between gate and drain, $C_{GD}$, is barely charged up. Only after $I_{ds}(t)$ reaches the level of $I_D$ and stops increasing may $C_{GD}$ start charging up and the $V_{ds}(t)$ may start to drop from $V_{DD}$ to zero. During this period of $V_{ds}(t)$ changing from $V_{DD}$ to zero, $V_{gs}(t)$ may remain almost as a constant (because $C_{GS}$ stops charging), which is called Miller voltage or Miller plateau. After $C_{GD}$ finishes charging and $V_{ds}(t)$ reaches zero, $V_{gs}(t)$ may continue to increase to the level of control voltage ($V_{on}$) as $C_{GS}$ continues to charge with $V_{gs}(t)$ increases.

Referring to FIG. 3B, the turn-off process is simply the reverse of turn-on: $V_{gs}(t)$ may start to decrease by discharging $C_{GS}$ first, until the Miller effect kicks in, where $C_{GD}$ may start to discharge. This may be the period where switching really begins. $V_{ds}(t)$ may start to increase from zero to $V_{DD}$, while $V_{gs}(t)$ may remain at a constant (the Miller voltage) and $I_{ds}(t)$ may remain as a constant as well. When $V_{ds}(t)$ reaches $V_{DD}$, the second half of the switching process may start: the $I_{ds}(t)$ may start to decrease from $I_D$ to zero, when $V_{gs}(t)$ drops below $V_{TH}$ and then $V_{gs}(t)$ may continue to decrease to a preset $V_{off}$ voltage level to complete the turn-off process.

In short, for switching a MOSFET or similar power semiconductor devices, $V_{ds}(t)$ can only be switched on or off during Miller plateau, which generally is either after the current is turned on during the switching-on process, or before the current starts to turn off during switching off process. The end results are the switching process as shown and described in FIG. 2C above.

Therefore, it would be desirable to provide a method that overcomes the above.

SUMMARY

In accordance with one embodiment, a circuit for switching a power semiconductor device is disclosed. The circuit for switching a power semiconductor device has a power semiconductor device. A controlled current pulse source is coupled to the power semiconductor device generating a positive current pulse to switch ON the power semiconductor device and a negative current pulse to switch OFF the power semiconductor device.

In accordance with one embodiment, a method for switching a power semiconductor device is disclosed. The method for switching a power semiconductor device comprises: sending a controlled current pulse to the power semiconductor device, wherein the controlled current pulse is a positive current pulse to switch ON the power semiconductor device and a negative current pulse to switch OFF the power semiconductor device.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

DESCRIPTION OF THE APPLICATION

The description set forth below in connection with the appended drawings is intended as a description of presently preferred embodiments of the disclosure and is not intended to represent the only forms in which the present disclosure can be constructed and/or utilized. The description sets forth the functions and the sequence of steps for constructing and operating the disclosure in connection with the illustrated embodiments. It is to be understood, however, that the same or equivalent functions and sequences can be accomplished by different embodiments that are also intended to be encompassed within the spirit and scope of this disclosure.

For switching a MOSFET, or similar power semiconductor devices, $V_{ds}(t)$ may only be switched on or off during Miller plateau, which generally is either after the current is turned on during the switching on process, or before the current starts to turn off during switching off process. Knowing this, one may think the MOSFET or similar kinds of voltage-controlled power semiconductor devices, should be controlled by a current pulse, instead of a step voltage like the traditional way. The purpose of using current pulse control may be to charge (for turn-on) or discharge (for turn-off) both $C_{GS}$ and $C_{GD}$ at the same time or in a very fast manner, instead of in a sequential manner (e.g. $C_{GS}$ first, then $C_{GD}$, then $C_{GS}$ again for turn-on), due to Miller effect, when using the voltage control method as explained above. The effect of this may be to reduce or eliminate the Miller effect; hence, increasing the switching speed and reducing the switching loss.

Figure 4:
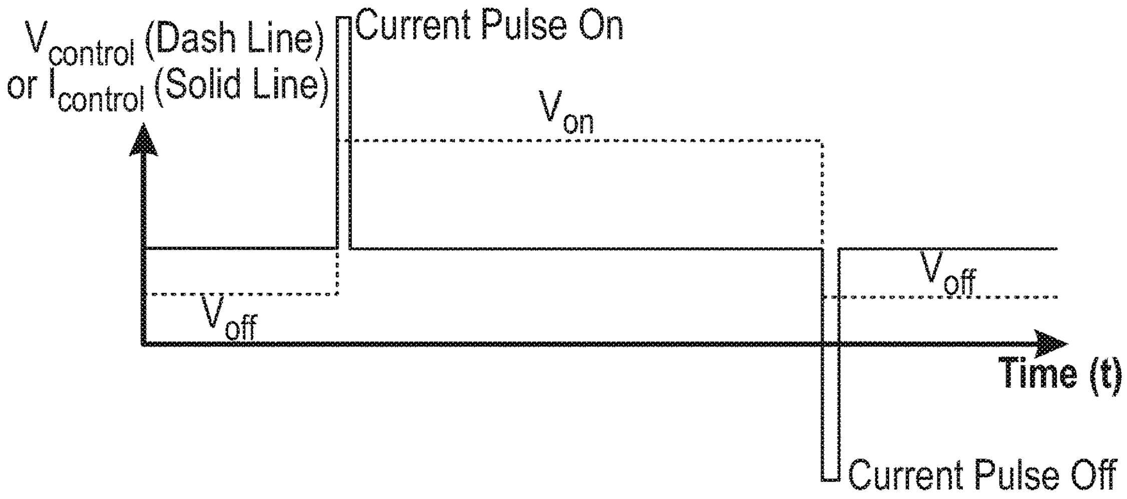
FIG. 4 (Prior Art)
FIG. 4. shows a voltage or current versus time diagram of different control methods between voltage control and current control, wherein both the current pulse height and duration for the turn-on and turn-off current control signals can be independently programmed or optimized.

Referring to FIG. 4, the differences between two different control methods may be shown. FIG. 4 may show the different control methods between voltage control and current control. The dash line may show the conventional ways of using step voltages ($V_{on}$ and $V_{off}$) to control the switching of the device, where the current control (solid line) is using a positive short current pulse to turn on the switching device and a negative current pulse to turn off the device. Both the current pulse height and duration for the turn-on and turn-off current control signals may be independently programmed or optimized.

Figure 5A:
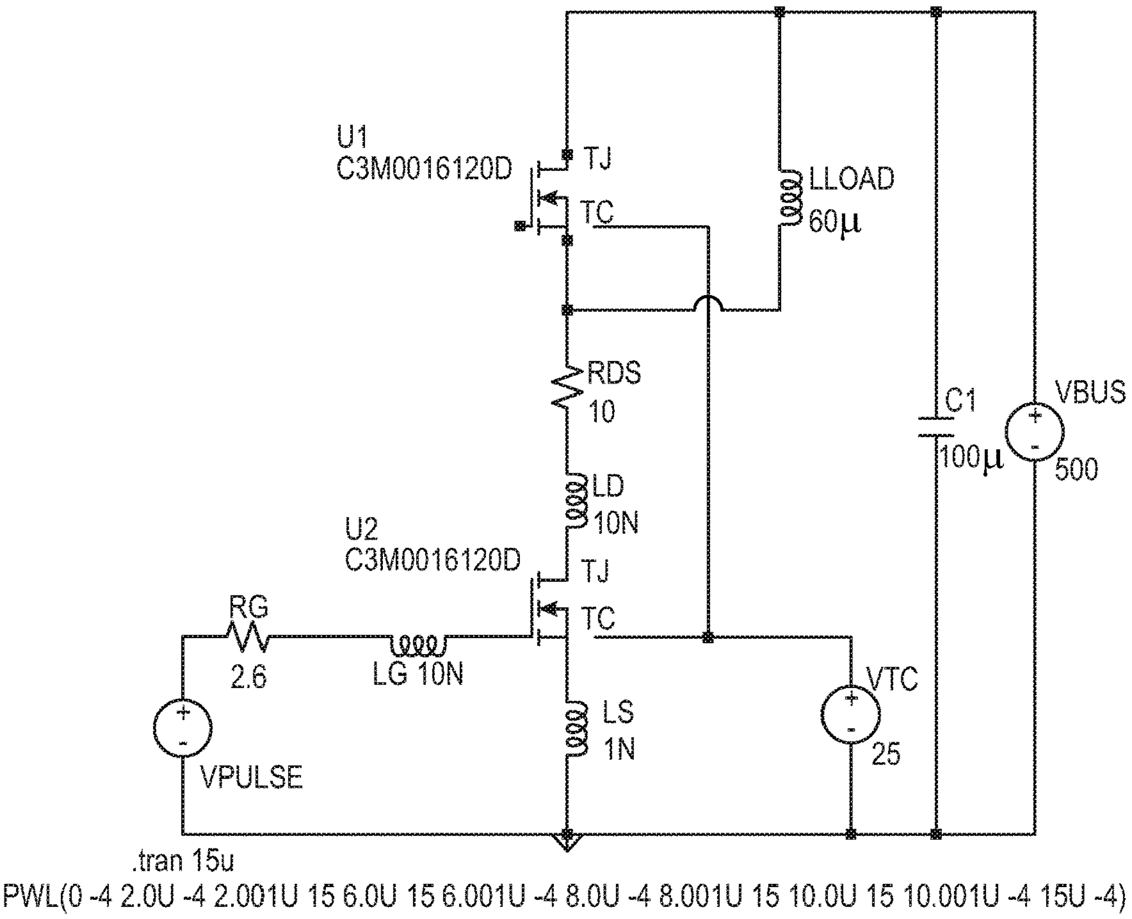
FIG. 5A (Prior Art)
FIG. 5A displays a circuit for LTspice simulation with conventional voltage control.
Figure 5B:
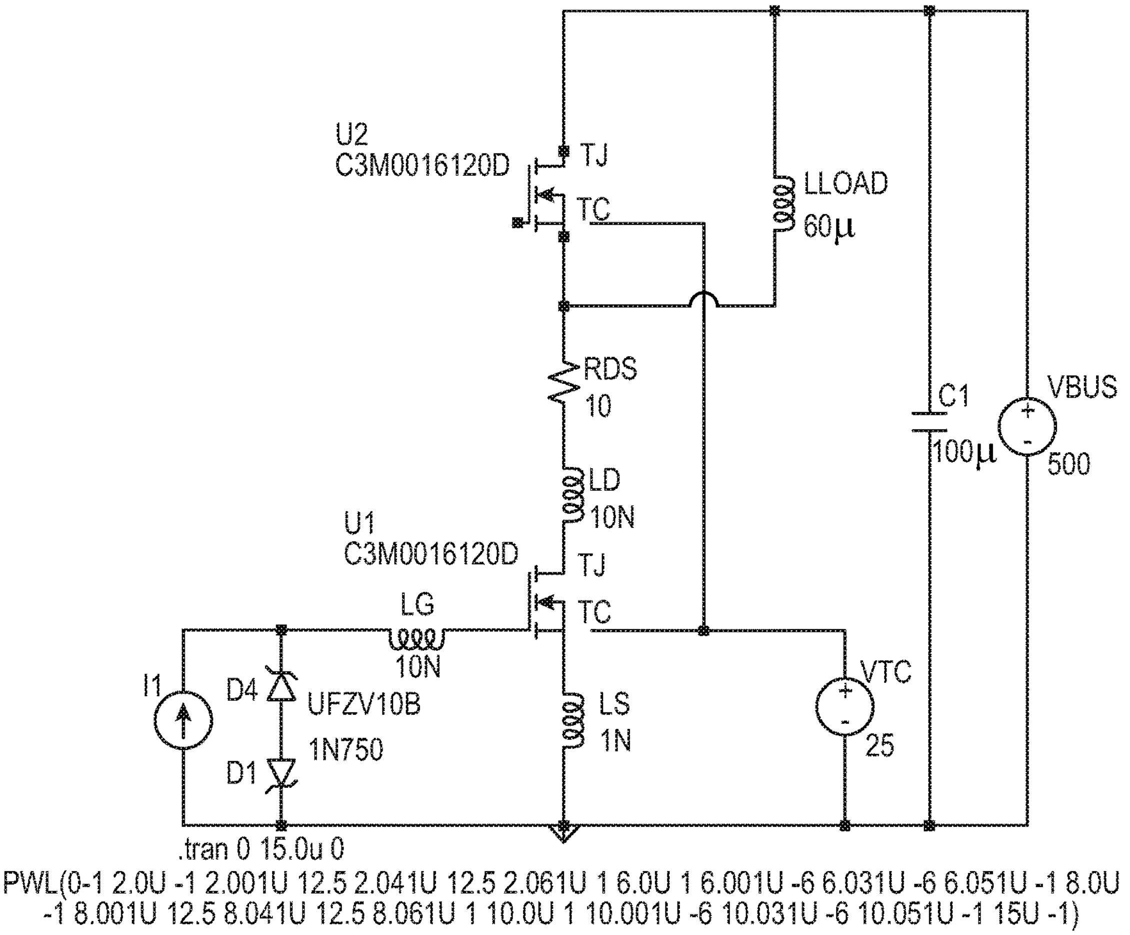
FIG. 5B shows the circuit of FIG. 5A for LTspice simulation displaying one embodiment of current control in accordance with one embodiment of the present invention.

Referring to FIGS. 5A-5B, simulation results to explain the difference between voltage and current control and compared outcomes may be disclosed. In accordance with one embodiment, simulation software such as LTspice, Pspice, Multism, or other types of simulation software may be used.

In the embodiment shown in FIGS. 5A-5B, the simulation software LTspice may have been used. All the circuit parameters and driving conditions may be contained in the LTspice schematics shown in FIGS. 5A-5B. In this embodiment, a SIC MOSFET may have been used. Specifically, a SIC MOSFET model C3M0016120D manufactured by Wolfspeed as may be seen in FIGS. 5A-5B.

In FIG. 5A, a double pulse simulation may be performed on the MOSFET, where a −4/15V off/on operational voltage may be applied as suggested by the manufacturer. The double (voltage) pulse may be for switching the MOSFET on at 2 us, switching off at 6 us to accumulate some current at the load, then switching on again at 8 us to compare the turn-on process with the turn-off process at the same current level as at 6 us, then eventually switch off again at 10 us until 15 us.

In FIG. 5B, one may do the same double pulse simulation, except the MOSFET is now switched on by a 12.5 A/40 ns current pulse, trailed for about 20 ns, and switched off by a −6 A/30 ns current pulse, also trailed for about 20 ns. Note that the choices of clamping Zener/APD diodes (D1 and D4) may be essential and not trivial. The Zener/APD diodes (D1 and D4) may be carefully chosen as part of the operation, mainly for voltage clamping purposes for obvious reasons, but also for not to exceed the transient voltage between gate and source terminals of the MOSFET, as specified and limited by the manufacturers. So, the steady state operating Ves values may very well be slightly lower than the manufacturer suggested.

The LTspice simulated results may be seen in FIGS. 6A-6D. It should be noted that the turn-on process starts at a time instance of 8.000 us, whereas the turn-off process starts at a time instance of 6.000 us, as designed by the double pulse simulation.

Figure 6A:
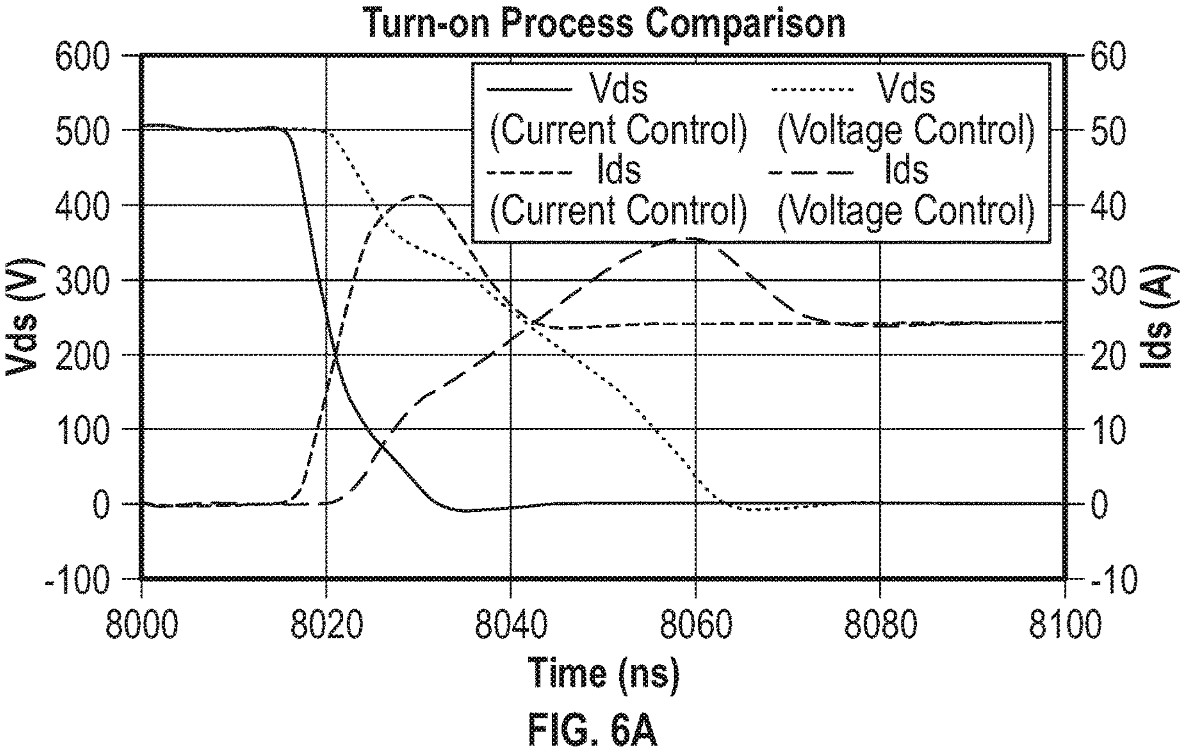
FIG. 6A shows a comparison of the turn-on processes between current control (solid lines) and voltage control (dash lines) in accordance with one embodiment of the present invention.
Figure 6B:
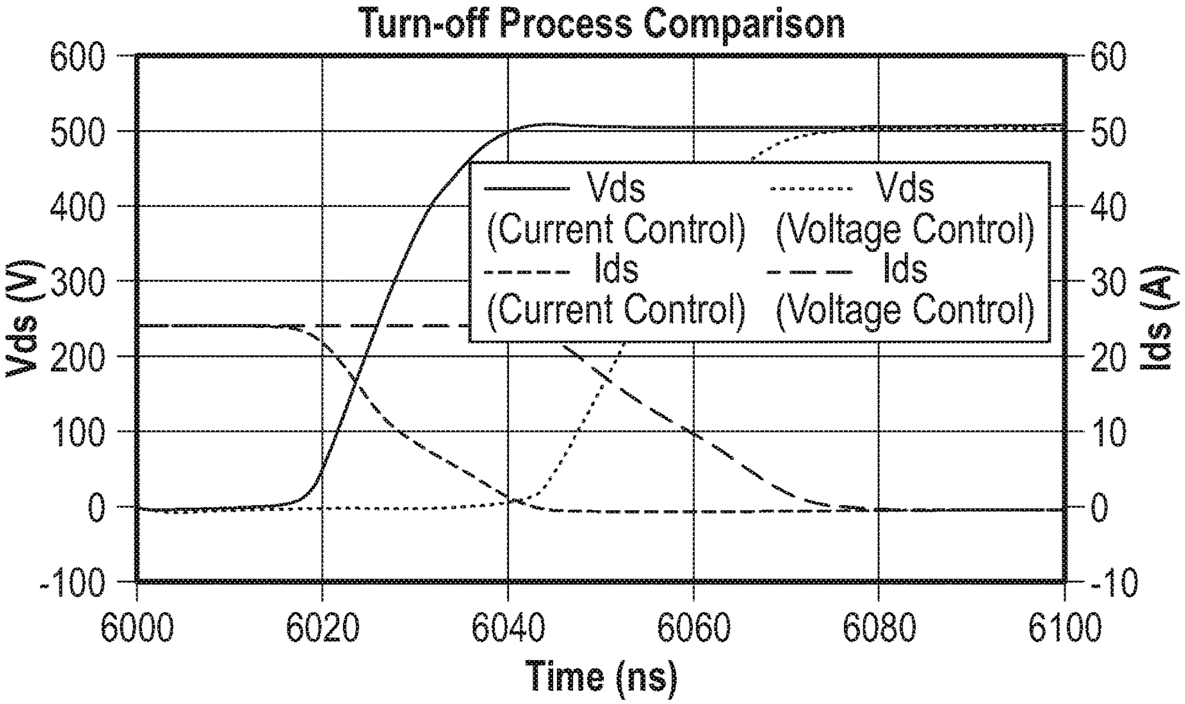
FIG. 6B shows a comparison of the turn-off processes between current control (solid lines) and voltage control (dash lines) in accordance with one embodiment of the present invention.
Figure 6C:
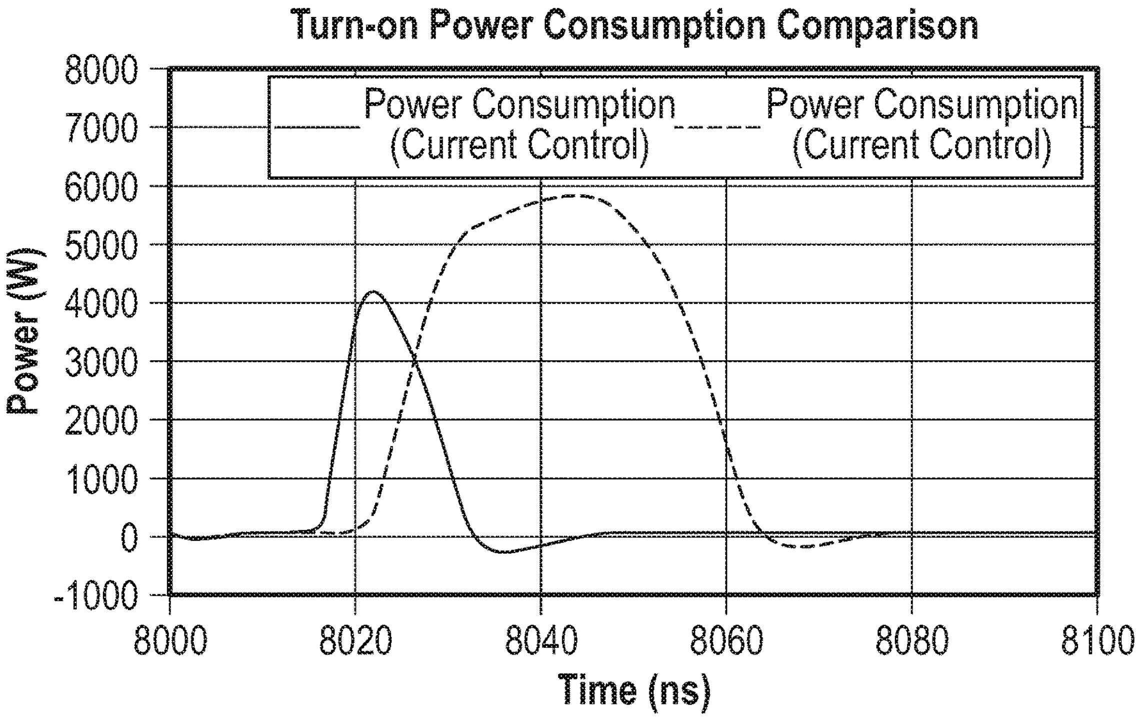
FIG. 6C shows a comparison of the consumed power ($V_{ds}$*$I_{ds}$) during turn-on between current control (solid lines) and voltage control (dash lines) in accordance with one embodiment of the present invention.
Figure 6D:
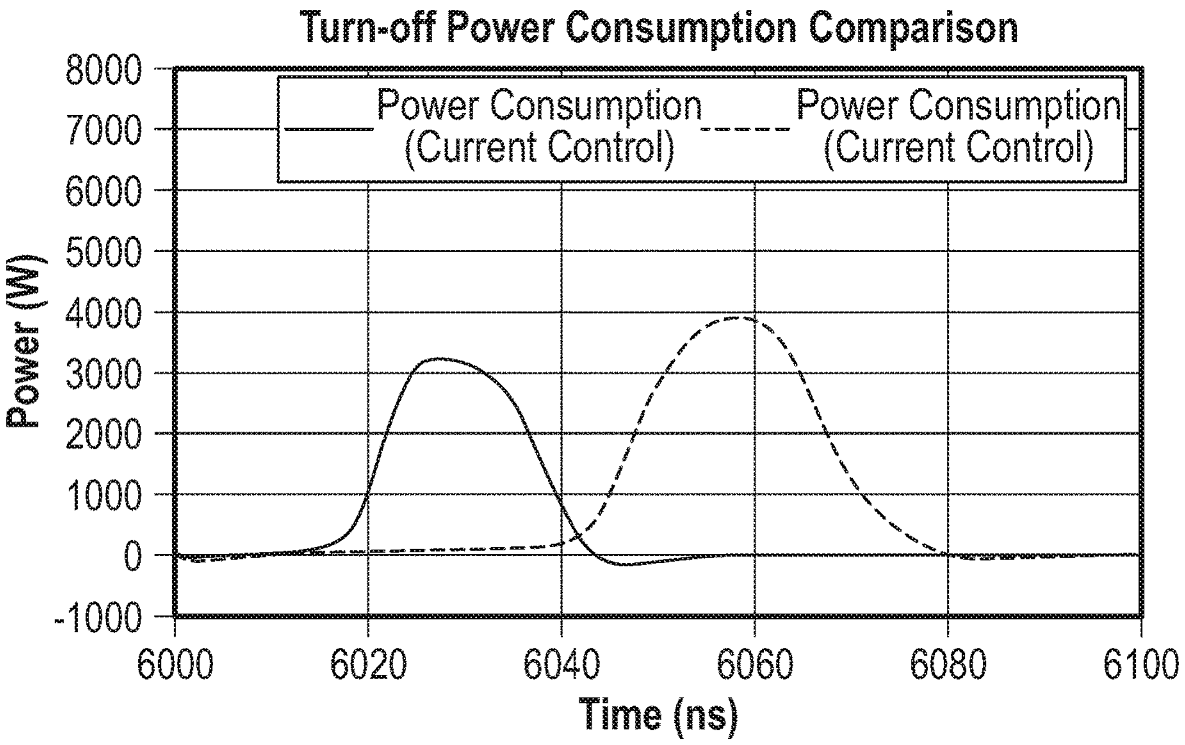
FIG. 6D shows a comparison of the consumed power ($V_{ds}$*$I_{ds}$) during turn-off between current control (solid lines) and voltage control (dash lines) in accordance with one embodiment of the present invention.

The difference of outcome between the current control method and the conventional voltage control method can be seen from FIGS. 6A-6D. FIG. 6A shows the comparison of turn-on processes between current control (solid lines) and voltage control (dash lines). In FIG. 6A, the turn-on delay of both $V_{ds}$ and $I_{ds}$ may be slightly improved but the switching speed is largely improved by the current control (see the slope difference of $dV_{ds}/dt$ and $dI_{ds}/dt$). FIG. 6B shows the comparison of the turn-off processes between current control (solid lines) and voltage control (dash lines). In FIG. 6B, it may seen that the switching speed for both $V_{ds}$ and $I_{ds}$ may be slightly improved but the turn-off delay is largely improved by the current control. FIG. 6C may show the power consumption ($V_{ds}*I_{ds}$) comparison during the turn-on process between current control (solid line) and voltage control (dash line). In FIG. 6C, it may be seen that the total switching period is about 18 ns with only about 40 uJ (the integration of $V_{ds}*I_{ds}$ during the 18 ns period) energy consumed by the current control method during the turn-on process, compared to 44 ns total switching period and 172 uJ consumed energy by the voltage control. The turn-on delay may be improved for about 4 ns. FIG. 6D may show the power consumption ($V_{ds}*I_{ds}$) comparison during the turn-off process between current control (solid line) and voltage control (dash line). In FIG. 6D, it may show a 24 ns total switching period and 53 uJ consumed energy by the current control, compared to 39 ns and 81 uJ by the voltage control. The turn-off delay is improved by about 24 ns. Both turn-on and turn-off delays are approximately the same (about 18 ns) when using the current control, which is a good feature for the timing control of device switching. Note that further simulations show that if the transient margin is larger, these improvements can be even better. The transient margin is mostly dictated by the device manufacturers.

The same analysis may be applied to many other different power semiconductor devices and obtain similar results. Generally speaking, the improvements may be mostly in the turn-on process, where the switching speed significantly increases and the switching loss largely reduced (to be even less than the turn-off process). This is fundamentally different from prior art literatures, where turn-on loss is always larger or significantly larger than the turn-off loss.

Figure 1A:
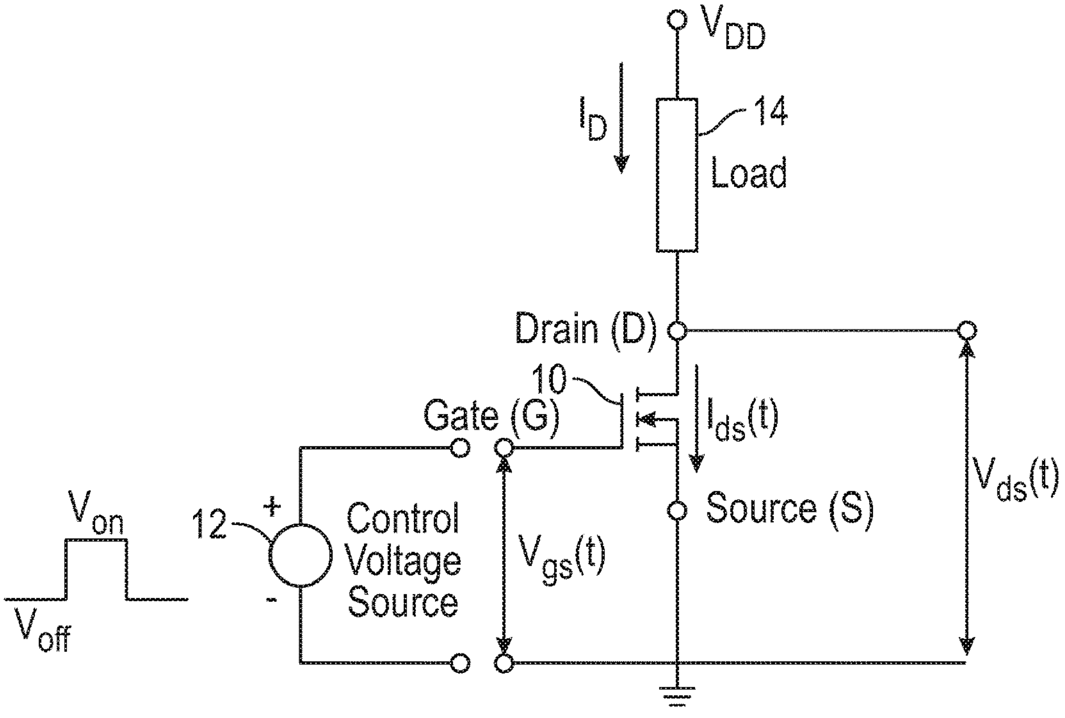
FIG. 1A (Prior Art)
FIG. 1A is a block diagram of an embodiment of a MOSFET device acting as a switch.
Figure 1B:
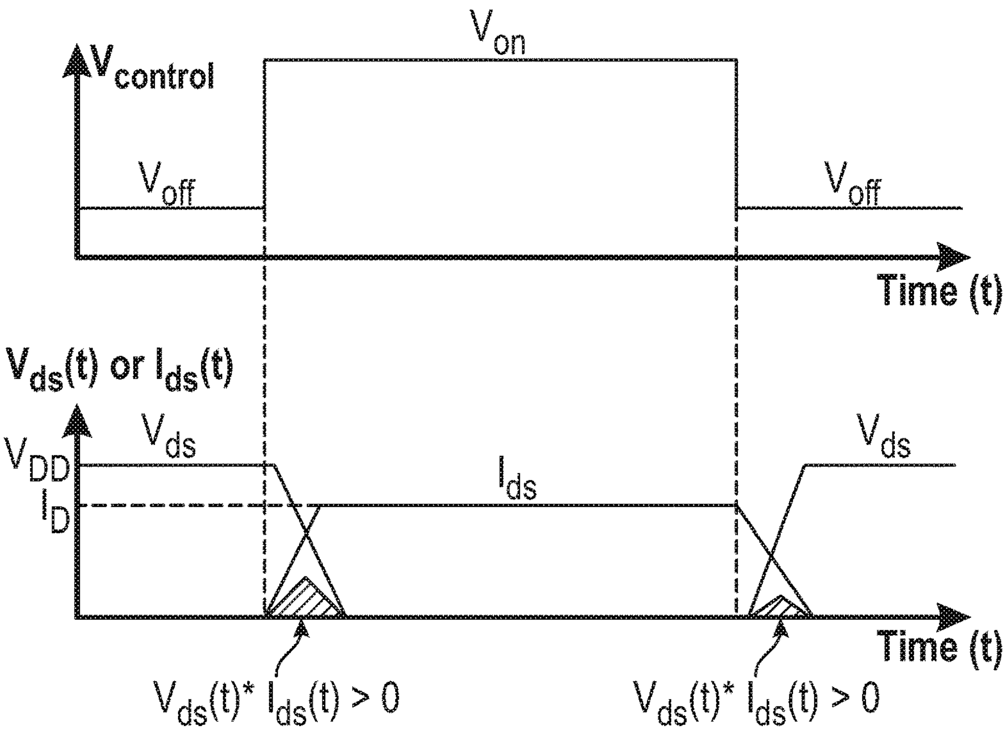
FIG. 1B (Prior Art)
FIG. 1B is a voltage or current versus time diagram showing the switching process of the MOSFET device of FIG. 1A where the MOSFET could consume certain power during the switching period using prior art methods.
Figure 2A:
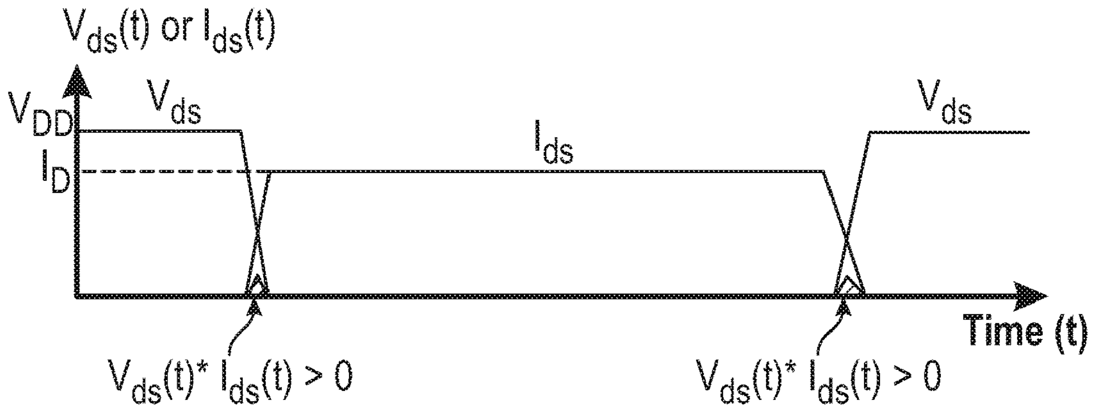
FIG. 2A (Prior Art)
FIG. 2A is a voltage or current versus time diagram of an ideal case of switching of the MOSFET device of FIG. 1A, where voltage $V_{ds}$ switches to zero quickly during the turn-on period before $I_{ds}$ starts to increase substantially, and vice versa for the turn-off period.
Figure 2B:
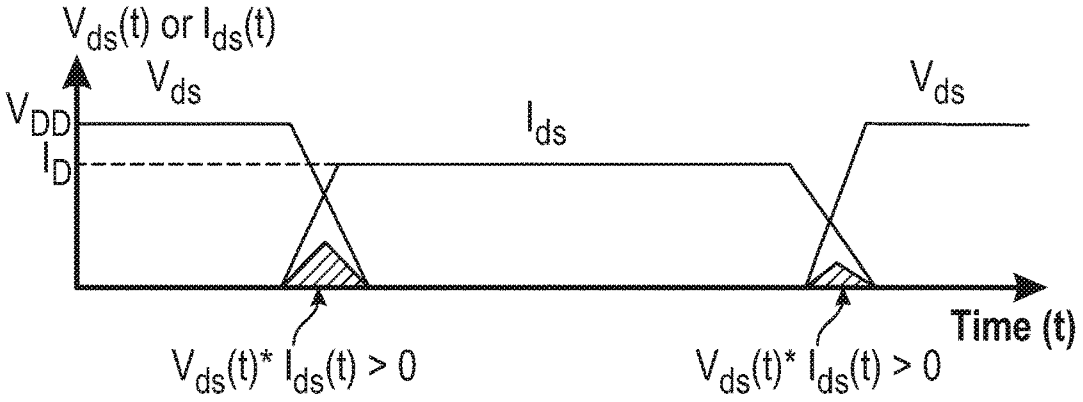
FIG. 2B (Prior Art)
FIG. 2B is a voltage or current versus time diagram of an intermediate case of switching of the MOSFET device of FIG. 1A, where voltage $V_{ds}$ and $I_{ds}$ switch around the same time but not fast enough so the overlap of $V_{ds}$ and $I_{ds}$ is larger than in the case of FIG. 2A.
Figure 2C:
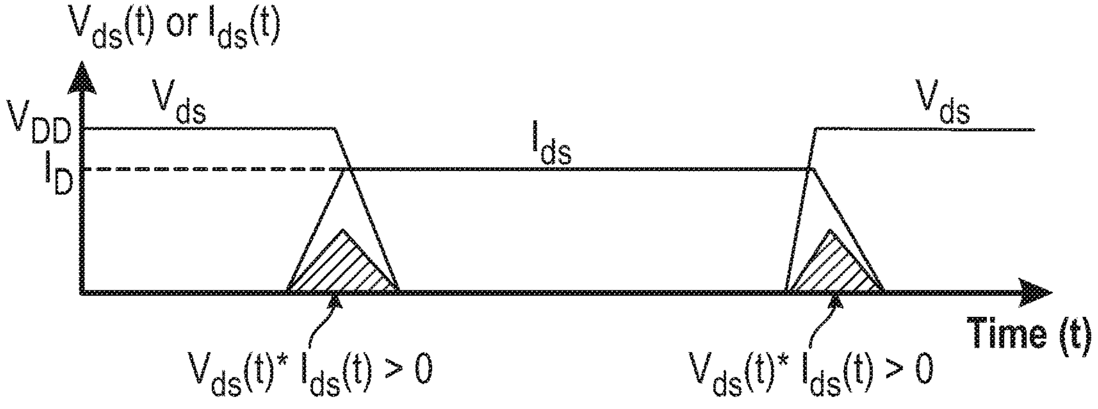
FIG. 2C (Prior Art)
FIG. 2C is a voltage or current versus time diagram of a worst-case scenario of switching of the MOSFET device of FIG. 1A, while keeping the same switching speed of $V_{ds}$ and $I_{ds}$, the voltage Vos does not start to switch before $I_{ds}$ reaches its maximum during the turn-on period, maximizing the overlap between $V_{ds}$ and $I_{ds}$, and vice versa for the turn-off period.
Figure 3A:
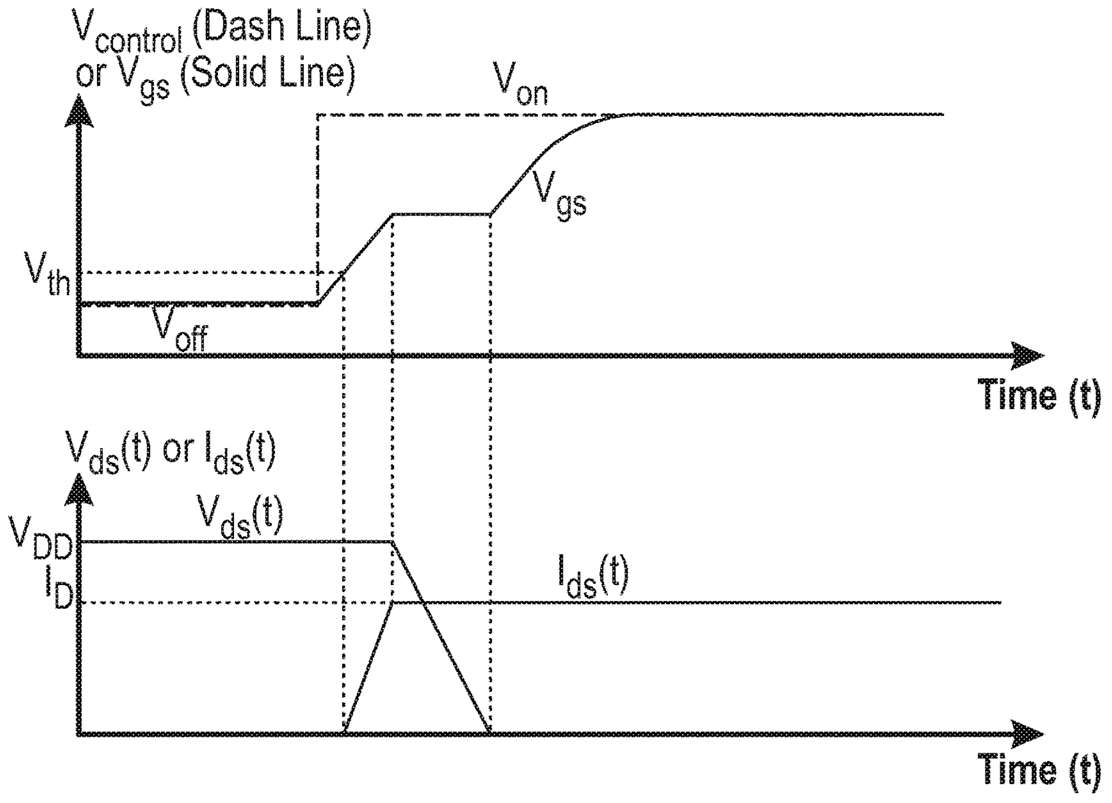
FIG. 3A (Prior Art)
FIG. 3A shows voltage or current versus time diagrams for a turn-on process of a MOSFET, where $V_{gs}(t)$ cannot follow the control Voltage $V_{on}$ closely, causing switch delay and $I_{ds}$ switching on first, then $V_{ds}$ switch off later.
Figure 3B:
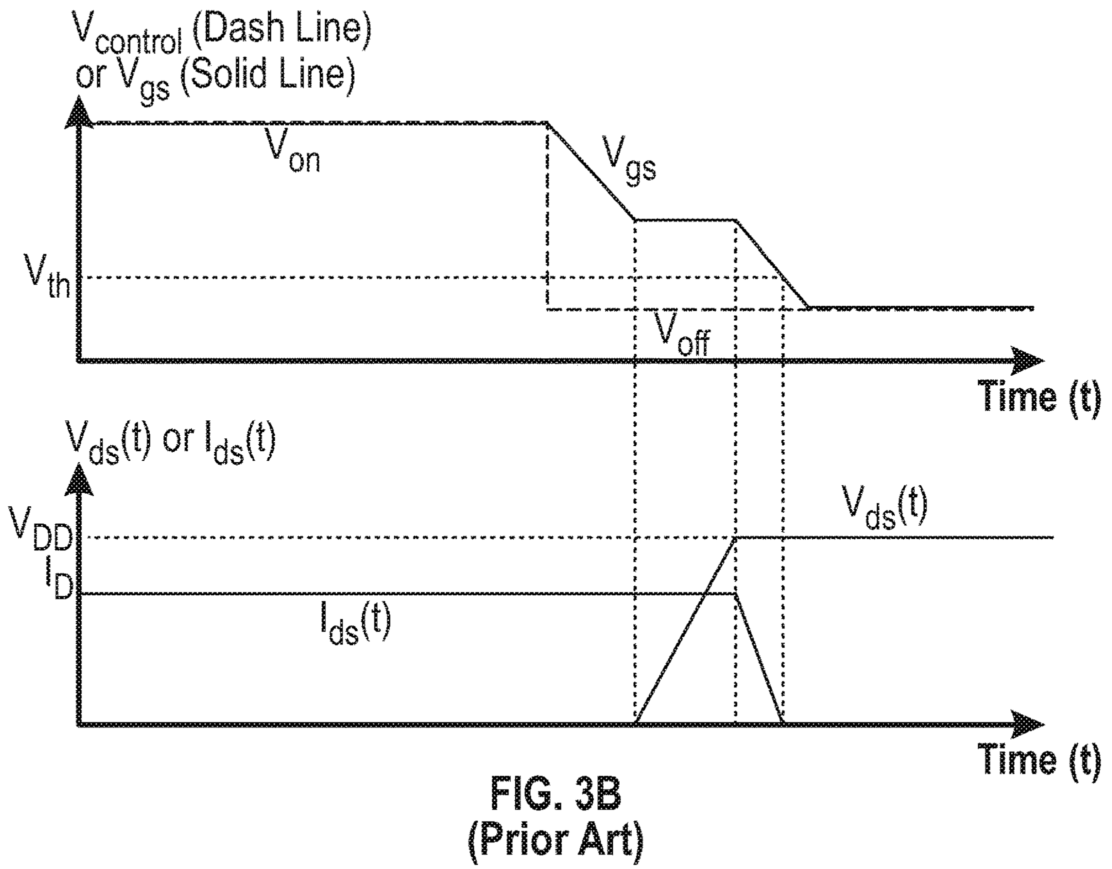
FIG. 3B (Prior Art)
FIG. 3B shows voltage or current versus time diagrams for a turn-off process of a MOSFET, where $V_{gs}(t)$ cannot follow the control Voltage $V_{off}$ closely, causing switch delay and $V_{ds}$ switching on first, then $I_{ds}$ switch off later.

There may be underlying physical reasons to explain the differences. When using the current control for turn-on, both $C_{GS}$ and $C_{GD}$ may be almost charged instantly. Once there is enough charge between drain and source, $V_{gs}$ changes from $V_{DD}$ to zero may also happen almost instantly. While establishing current flow takes certain physical movement due to electron mobility, the $I_{ds}$ increases from zero to $I_D$ would happen later than the $V_{gs}$ change, i.e. the current change happens AFTER the voltage change. This is a very different scenario when using voltage control and going through the Miller effect to complete the switching as explained earlier, where the current change happens BEFORE the voltage change. Essentially, the current control method improves the turn-on process from FIG. 2C type of process (due to voltage control) to FIG. 2A type of process.

However, one may not say the same for the turn-off process. Because there is current flow ($I_D$) to begin with for the turn-off process, discharging the capacitors ($C_{GS}$ and $C_{GD}$) fast cannot turn off the current instantly as the current flow keeps on replenishing the charges. It may only reduce the current flow at a certain speed. While there is current flow, the voltage cannot be increased instantly either, i.e. drain being isolated from source, simply because there is always some electrical connection between drain and source due to current flow. So the voltage increase may only happen as the current decreases. Current control method or votlage control method does not alter the fundamental process significantly. The only major difference would be the turn-off delay as the current control method can establish the discharging condition faster than the voltage control method. So, both current control and voltage control methods pretty much make the turn-off remain as the FIG. 2B type of process, only the switch delay may be very different.

Besides the advantages that the current control method can provide as mentioned above, it may also be possible to adjust the turn-off current pulse to be large or long enough to drain out the displacement current going through $C_{GD}$, where the displacement current $I_{DG}=C_{GD}*(dV_{ds}/dt)$. This way, it may eliminate the need to use a so-called Miller-clamping circuit (or similar designs) to avoid the false turn-on during the turn-off process, simplifying the overall driver circuitry considerations. Note that the possible false turn-on during the turn-off process due to the displacement current cannot be eliminated from the clamping diodes. Hence, to designate the right amount of turn-off current pulse may be essential. Only a current control method provides this option (avoiding false turn-on) without adding more circuit design considerations, while the conventional voltage control method calls for a so-called Miller-clamping circuit (or similar design) to drain out this displacement current.

To summarize, the above disclosed method uses a current pulse to switch on or off a MOSFET or other voltage-controlled power semiconductor devices. This current control method may consist of a current source, capable of generating a positive or negative short current pulse and connected in parallel with voltage clamping diode(s). The integration of the current pulse over the pulse duration, i.e. the total injected electrical charges, should be much larger than the total gate charge, specified by the manufacturer. The duration of the current pulse should be short enough to have the effect of fast turn-on, usually a few tens nanoseconds, no more than 100 ns. The shape of the current pulse does not need to be squared but can be adjusted so that it may achieve fast turn-on and turn-off, or even avoid the false turn-on during the turn-off process. The voltage clamping diode(s) define the gate-source operating voltages. It may consist of at least one Zener or Avalanche diode whose breakdown voltage will be the on-voltage level of the gate-to-source voltage. The forward bias voltage of the diode D1 may be the off-level voltage. This on or off-level gate-to-source voltage can be adjusted by adding more Zener or Avalanche diodes in each voltage direction. It can be multiple diodes connected in series, the sum of whose breakdown voltages defines the on or off voltage, depending on the connected direction of the clamping diodes. Note the forward bias voltage of those reversely connected diodes should also be included in the final on or off voltage level, not just the breakdown voltages. Most importantly, the choices of on-off voltage levels from the clamping diodes should be carefully chosen so that when working with the current pulse, the gate-to-source voltage would not exceed the transient limits, specified by the manufacturer. This can only be achieved by either simulation or careful measurement, or both.

Figure 7A:
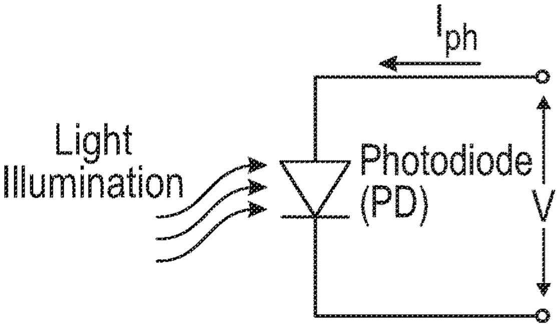
FIG. 7A (Prior Art)
FIGS. 7A-7B shows a prior art principle of illuminated photodiodes acting as a current source.
Figure 7B:
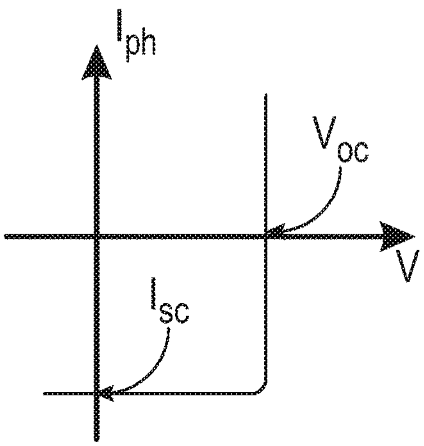
FIG. 7B (Prior Art)

Below, two ways of implementing the current control as the extensions of the present invention may be disclosed. First, as may be seen in FIG. 7, when a photodiode (PD) is illuminated by light, it may behave like a constant current source (roughly between zero voltage and the open circuit voltage ($V_{oc}$), which is mostly determined by the PD material when illuminated by strong enough light intensity). The photocurrent at short-circuit condition may be called short-circuit current ($I_{sc}$), which may be proportional to the light amount received. It should be noted that when the photocurrent ($I_{ph}$) is in its negative value, which means between 0 and $V_{oc}$, the photodiode (PD) may be acting like an energy source.

Figure 8A:
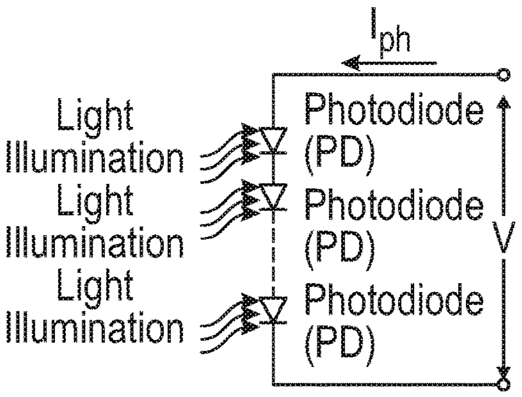
FIG. 8A-8B show an optically controlled current source with high enough voltage to drive a MOSFET in accordance with one embodiment of the present invention.
Figure 8B:
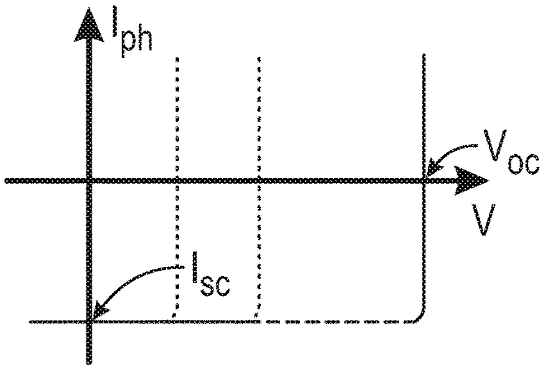

Referring to FIG. 8, if one were to seriesly connect a large enough number of PDs, and each of the PDs may receive an approximately equal amount of light intensity illumination, one can build up an (optically-controlled) current source with high enough voltage to replace the current source shown in FIG. 5B to drive the MOSFET as described process above.

Figure 9A:
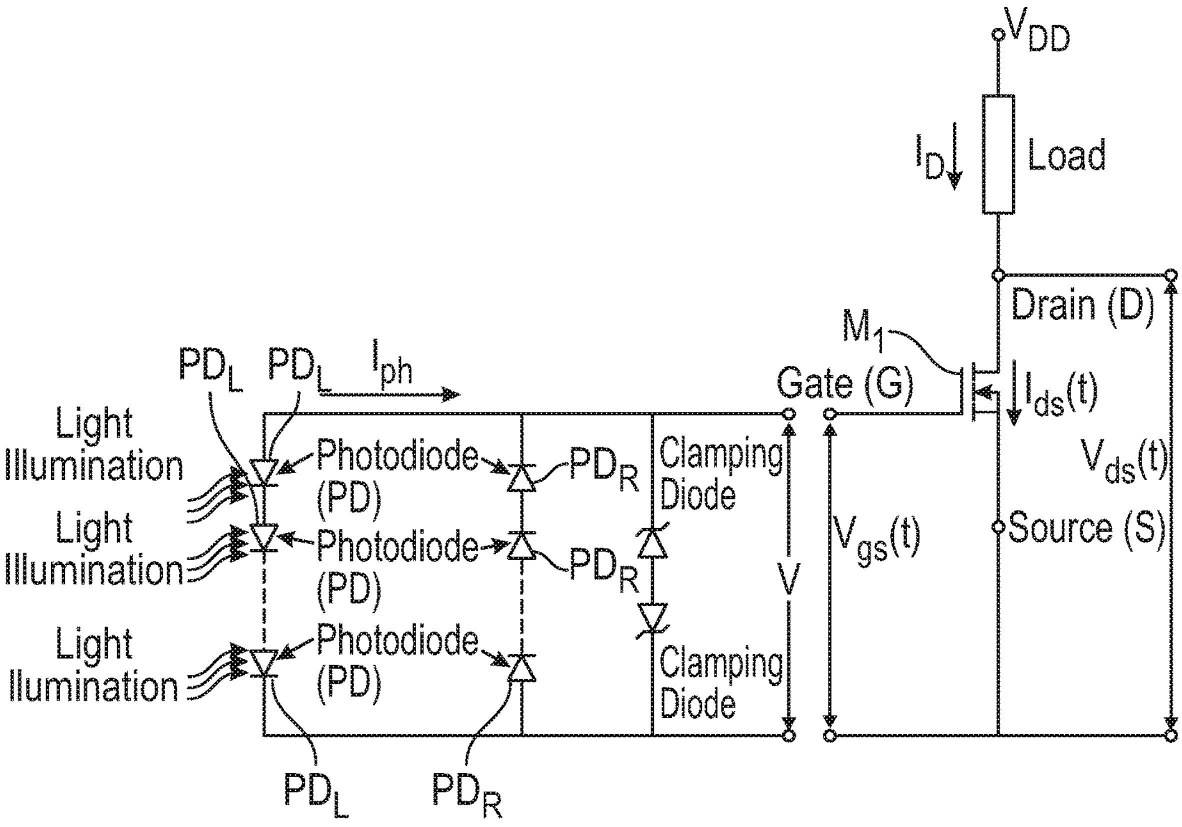
FIG. 9A shows a turn-on process of a MOSFET by an optically generated current pulse in accordance with one embodiment of the present invention.

Referring to FIG. 9A, to turn on the MOSFET M1, the left branch of the seriesly connected photodiodes $PD_L$ may be evenly illuminated with an optical pulse, which would then generate an electrical current pulse ($I_{ph}$). So long as this electrical pulse satisfies the requirements of the current pulse to turn on the MOSFET M1 as explained in FIG. 5B and related description, the MOSFET M1 is turned on by the optical pulse signal. Note that the right branch of reversely connected photodiodes $PD_R$ is not illuminated, and it may act effectively like an open circuit in this case, not participating in the turn-on process of the MOSFET M1 at all.

Figure 9B:
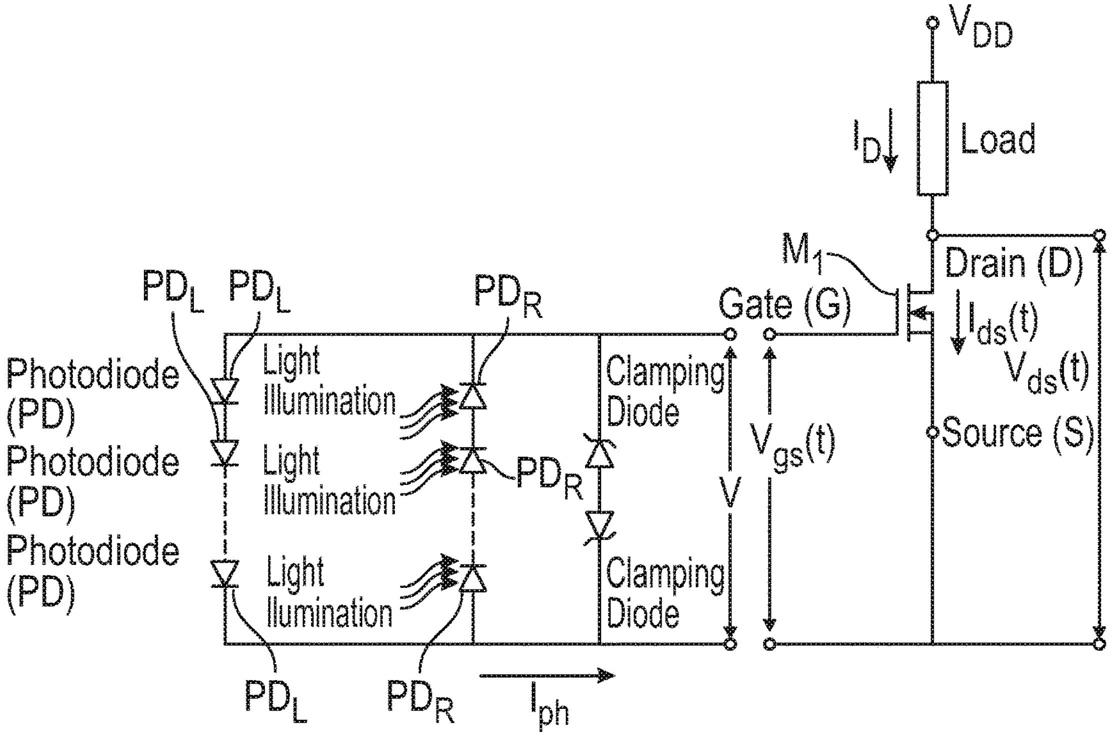
FIG. 9B shows a turn-off process of a MOSFET, by an optically generated current pulse in accordance with one embodiment of the present invention.

Referring now to FIG. 9B, another optical pulse would illuminate on the right branch of the seriesly connected photodiodes $PD_R$. The number of photodiodes $PD_R$ in the right branch is likely to be different from the left branch of photodiodes $PD_L$. The left branch of photodiodes $PD_L$ may need to build up a $V_{oc}$ larger than the $V_{on}$ for the MOSFET M1, whereas in the right branch $V_{oc}$ is to be larger than $V_{off}$ of the MOSFET M1. Because of the opposite polarity of the right branch of photodiodes $PD_R$, it may produce an opposite direction of the current pulse to turn off the MOSFET M1. Hence, the turn-on and the turn-off current pulse in FIG. 4 may be generated by different optical pulses, illuminating at different branches of photodiodes, at different instances of time.

The illumination of the photodiodes $PD_L$ or $PD_R$ may be brought about in a variety of ways. For example, the photodiodes $PD_L$ or $PD_R$ may be illuminated through free space illumination, through an optical fiber, through a plurality of optical fibers, or similar illuminating mechanisms. The above are given as examples and should not be seen in a limiting manner. Also, there may be no need for any external power source, provided the optical power is strong enough to drive the MOSFET M1. Additionally, because the whole control circuitry, including photodiodes $PD_L$ or $PD_R$ and clamping diodes, may be totally electrically isolated by the optical path, the switching MOSFET M1 is essentially at a status of electrically floating, meaning that the switching MOSFET M1 may be independently connected with other similar devices (provided they are all being controlled the same way), without adding the consideration of electrical potential.

In short, current control scheme described above has many advantages over the prior art schemes. As disclosed above, the current control scheme described provides the following benefits:

No external power supply is needed to control. All the control power needed to drive the switching device (MOSFET, etc) may be provided by optical power.

Totally electrically isolated. This means each switching device (MOSFET, etc) may be individually controlled while connected with other switching devices in series or in parallel, without adding the complexity of a driver board circuit design, like the bootstrap circuitry.

If the optical power is brought in by optical fiber with extended length, the driver board does not need to be placed right next to the switching device, which means the driver board can be placed far away from the high voltage line, adding ease for maintenance and control. In the mean time, this arrangement can also make the switching device packaging even more compact when building a solid state tranformer, just as one example.

Extremely high common mode transient immunity (CMTI), especially when the driver board is far away from the high voltage line.

EMI immune.

Besides the advantages of the current control scheme described above, there are even more benefits of using optically controlled current sources as may be disclosed below.

Figure 10:
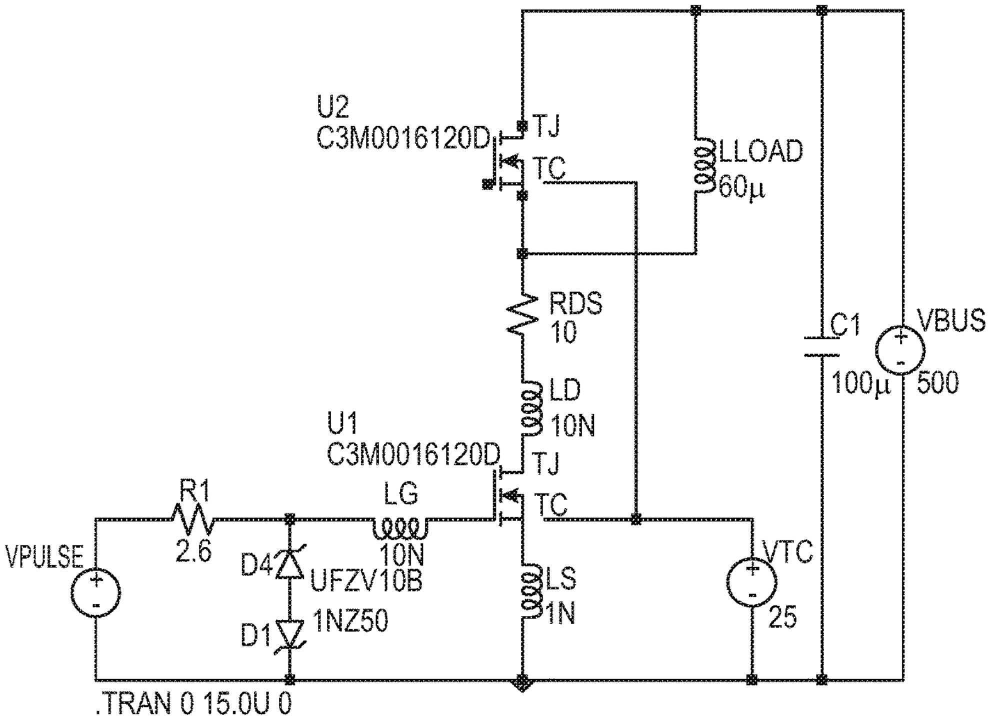
FIG. 10 shows a circuit for LTspice simulation using a voltage pulse to generate a current pulse for switching the MOSFET in accordance with one embodiment of the present invention.

A second way of implementing a pulse current source is by actually using a voltage pulse itself as may be shown in FIG. 10. In FIG. 10 a voltage pulse $V_{pulse}$ may be used to generate a current pulse for switching the MOSFET M1. It should be noted that the configuration of this circuit is almost identical to that shown in FIG. 5A (the conventional way of MOSFET switching), except for the control signal shape difference and the clamping diodes D1 and D4.

Figure 11:
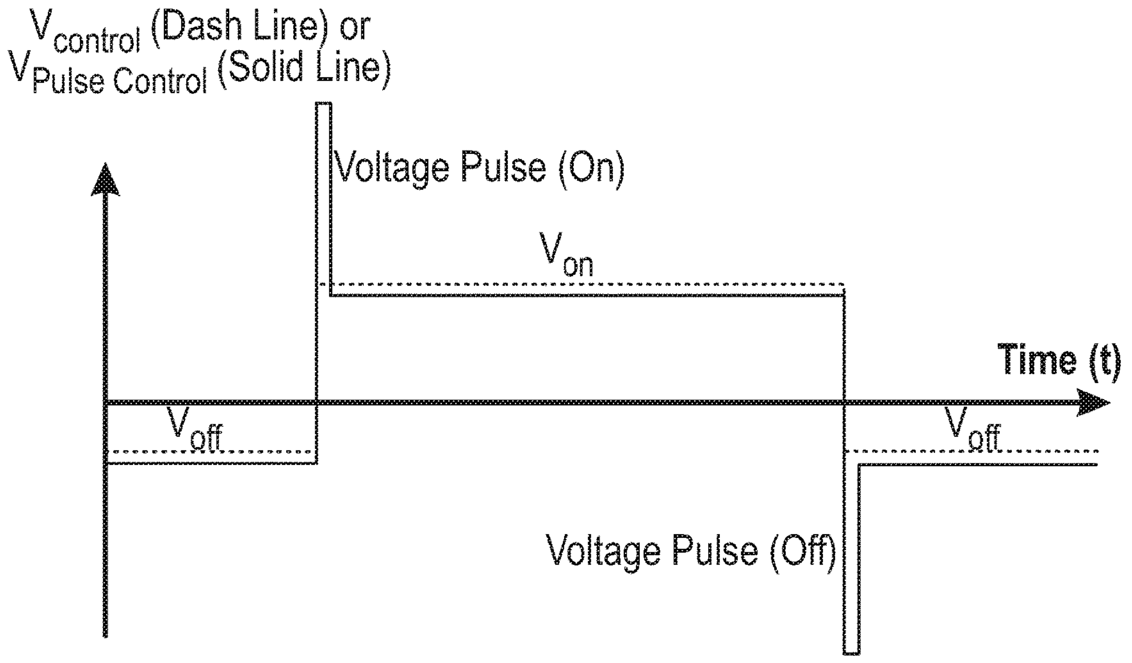
FIG. 11 shows a pulse voltage control profile wherein a short voltage pulse is added at the beginning of the turn-on or turn-off signal to produce a current pulse in accordance with one embodiment of the present invention.
Figure 12A:
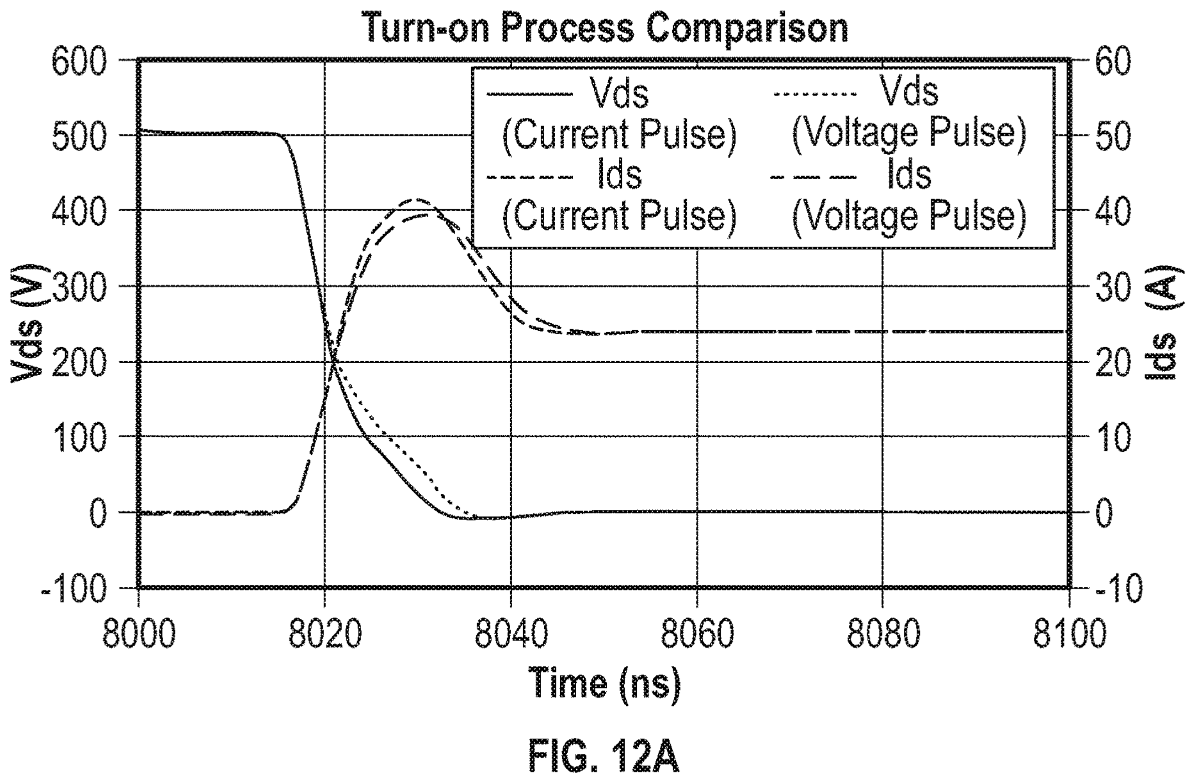
FIG. 12A shows a comparison of the turn-on processes between current pulse control (solid lines) and voltage pulse control (dash lines)
Figure 12B:
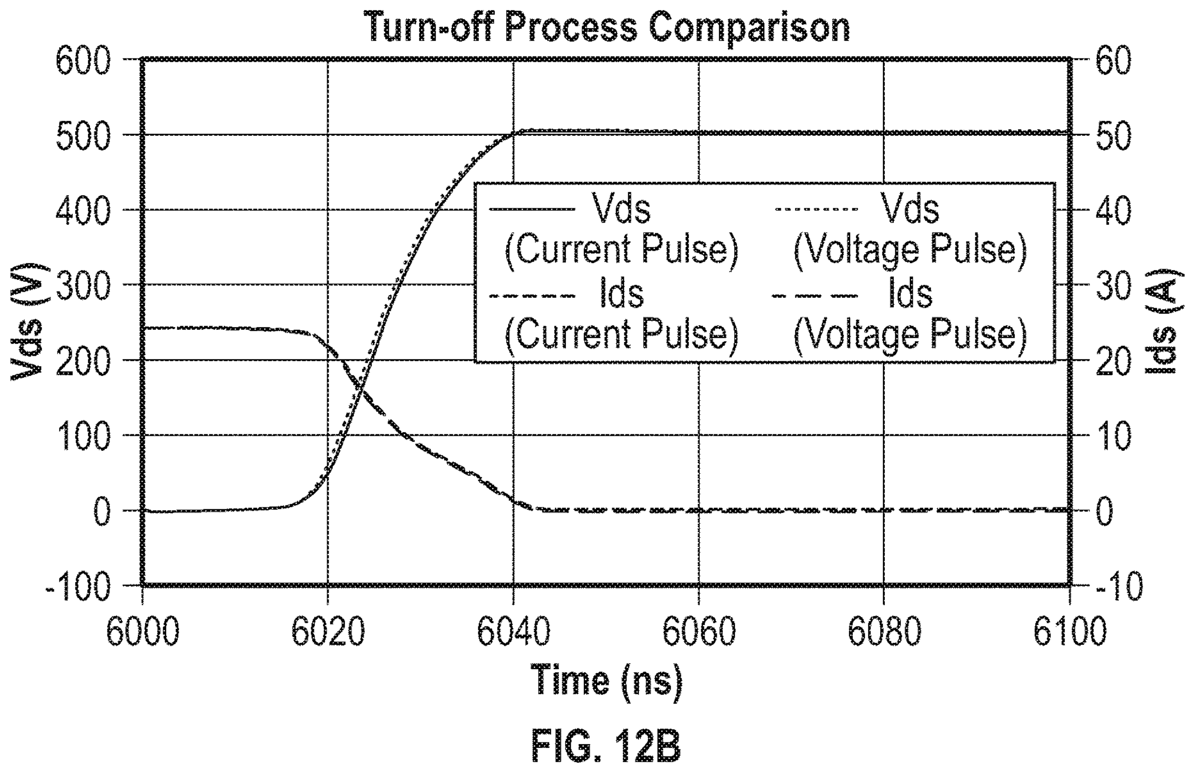
FIG. 12B shows a comparison of the turn-off processes between current pulse control (solid lines) and voltage pulse control (dash lines)
Figure 12C:
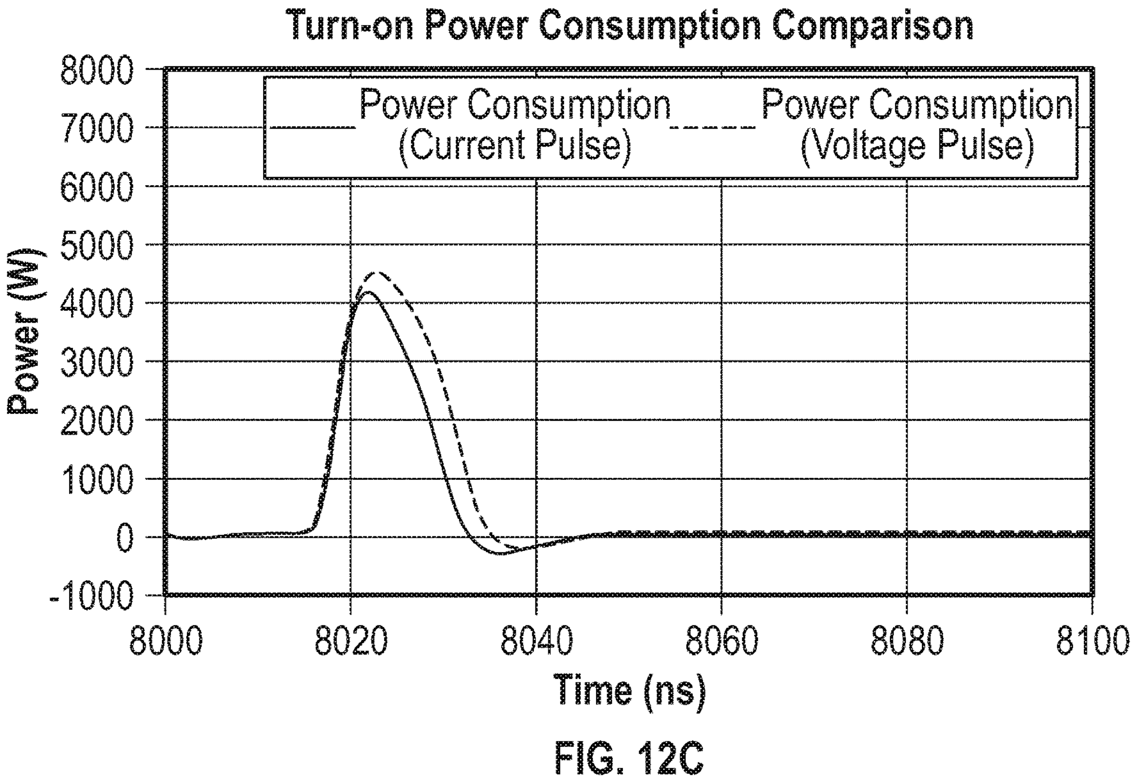
FIG. 12C shows a comparison of the consumed power ($V_{ds}$*$I_{ds}$) during turn-on between current pulse control (solid lines) and voltage pulse control (dash lines)
Figure 12D:
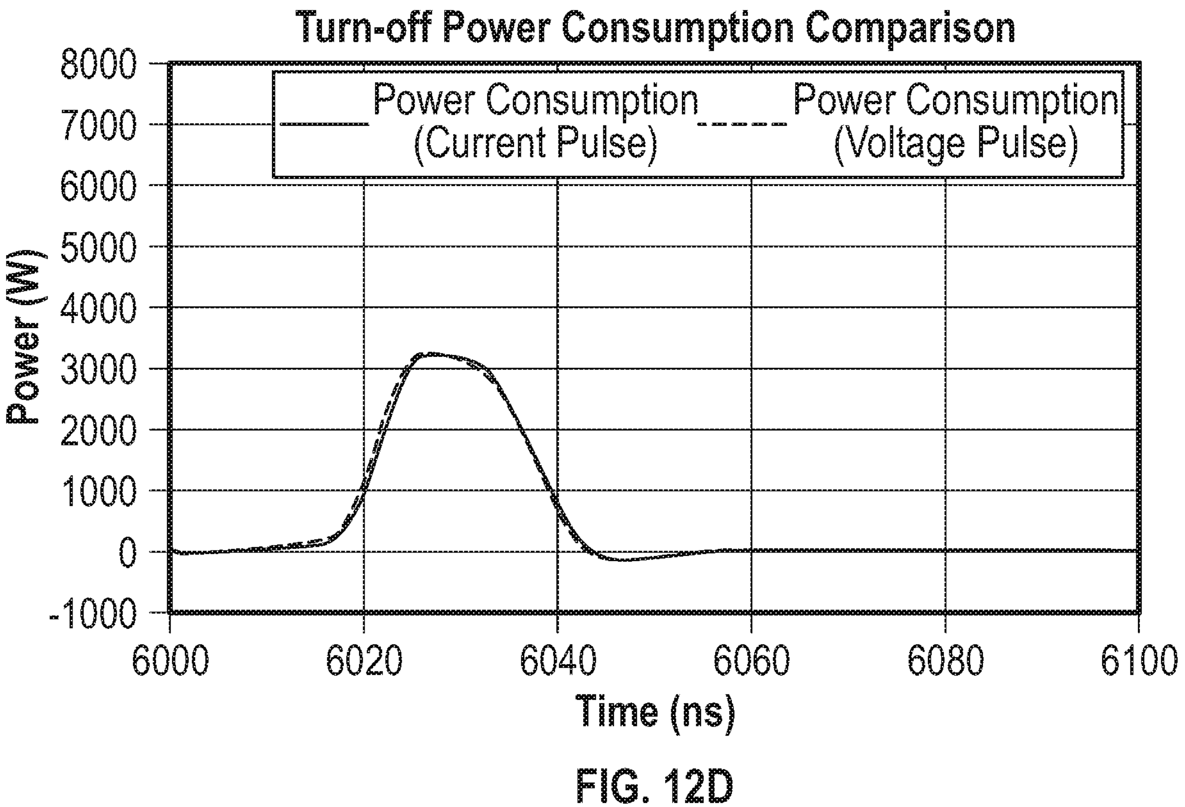
FIG. 12D shows a comparison of the consumed power ($V_{ds}$*$I_{ds}$) during turn-off between current pulse control (solid lines) and voltage pulse control (dash lines).

As shown in FIG. 11, the pulse voltage control profile of the circuit in FIG. 10 may be very similar to the conventional way, except for adding a very short voltage pulse at the beginning of the turn-on or turn-off signal. This voltage pulse may be meant to produce a current pulse profile similar to the one in FIG. 5B.

The LTspice simulated results may be compared with the current control simulation results as shown in FIGS. 12A-12D. The switching behaviors may be almost identical except at the trailing edge of the turn-on process. This may be understandable as the voltage pulse cannot produce exactly the same current pulse as before, because of the voltage build-up at the gate. So the current pulse produced by the voltage pulse may be smaller in amplitude at the trailing edge than the leading edge. However, one advantage of using a voltage pulse, instead of a current pulse, besides easier implementation, is that it may define the $V_{on}$ level without consuming much power on the driver side, as long as the $V_{on}$ level is lower than the clamping level, which is defined by the clamping diodes D1 and D4, where in direct current pulse control, the $V_{on}$ level is pretty much defined by the clamping diodes D1 and D4 and it may need certain amount of current flow to maintain its level. For the turn-off process, it is the same situation as in turn-on, although the turn-off process is much less sensitive to the exact current control signal profile.

In summary, the present disclosure proposes a way of using short current pulses to control the on/off switching process of a MOSFET, or similar kind of power semiconductor devices. It shows significant improvement in switching speed and energy efficiency in the turn-on process but in the turn-off process, the major improvement is on the turn-off delay aspect.

When applying this concept by using optical power links to directly control a MOSFET or similar kind of power semiconductor devices, it can provide extra significant benefits, listed above, that no other electronic circuit design can easily obtain.

Last but certainly not least, it has been also demonstrated a simple way of producing the pulse current control signal by using a voltage pulse, which can achieve very similar results as in short pulse current control.

The foregoing description is illustrative of particular embodiments of the application but is not meant to be a limitation upon the practice thereof. The following claims, including all equivalents thereof, are intended to define the scope of the application.

The invention claimed is:

1. A circuit for switching a power semiconductor device comprising:

a power semiconductor device; and a controlled current pulse source coupled to the power semiconductor device generating a positive current pulse to switch ON the power semiconductor device and a negative current pulse to switch OFF the power semiconductor device, wherein the controlled current pulse source comprises a first plurality of photodiodes connected in series and a second plurality of photodiodes connected in series and parallel to the first plurality of photodiodes, wherein the second plurality of photodiodes are an opposite polarity from the first plurality of photodiodes.

2. The circuit of claim 1, wherein the positive current pulse charges both a capacitance between a gate and a source $C_{GS}$ of the power semiconductor device and a capacitance between the gate and a drain $C_{GD}$ of the power semiconductor device concurrently to switch ON the power semiconductor device and the negative current pulse discharges both $C_{GS}$ and $C_{GD}$ concurrently to switch OFF the power semiconductor device.

3. The circuit of claim 2, wherein the controlled current pulse source adjusts the negative current pulse to drain out a displacement current going through $C_{GD}$.

4. The circuit of claim 1, comprising at least one clamping diode coupled in parallel to the controlled current pulse source to limit a transient voltage between the gate and the source of the power semiconductor device.

5. The circuit of claim 4, wherein the at least one clamping diode has a breakdown voltage which will be an on-voltage level of a gate-to-source voltage of the power semiconductor device.

6. The circuit of claim 4, wherein the at least one clamping diode has a forward bias voltage which will be an off-level voltage of the power semiconductor device.

7. The circuit of claim 1, comprising at least one clamping diode coupled in parallel to the controlled current pulse source in each voltage direction.

8. The circuit of claim 1, wherein the first plurality of photodiodes is evenly illuminated with a first optical pulse generating a voltage larger than $V_{on}$ for the power semiconductor device.

9. The circuit of claim 1, wherein the second plurality of photodiodes is evenly illuminated with a second optical pulse generating a voltage larger than $V_{off}$ for the power semiconductor device.

10. A circuit for switching a power semiconductor device comprising:

a power semiconductor device;

a controlled current pulse source coupled to the power semiconductor device generating a positive current pulse to switch ON the power semiconductor device and a negative current pulse to switch OFF the power semiconductor device, wherein the positive current pulse charges both a capacitance between a gate and a source $C_{GS}$ of the power semiconductor device and a capacitance between the gate and a drain $C_{GD}$ of the power semiconductor device concurrently to switch ON the power semiconductor device and the negative current pulse discharges both $C_{GS}$ and $C_{GD}$ concurrently to switch OFF the power semiconductor device, wherein the controlled current pulse source adjusts the negative current pulse to drain out a displacement current going through $C_{GD}$; and at least one clamping diode coupled in parallel to the controlled current pulse source to limit a transient voltage between the gate and the source of the power semiconductor device;

wherein the controlled current pulse source comprises a first plurality of photodiodes connected in series and a second plurality of photodiodes connected in series and parallel to the first plurality of photodiodes, wherein the second plurality of photodiodes are an opposite polarity from the first plurality of photodiodes.

11. The circuit of claim 10, wherein the first plurality of photodiodes is evenly illuminated with a first optical pulse generating a voltage larger than $V_{on}$ for the power semiconductor device and the second plurality of photodiodes is evenly illuminated with a second optical pulse generating a voltage larger than $V_{off}$ for the power semiconductor device.

* * * * *